United States Patent

Smith et al.

[11] Patent Number: 5,923,565
[45] Date of Patent: Jul. 13, 1999

[54] APPARATUS AND METHOD FOR EXTRACTING CAPACITANCE IN THE PRESENCE OF TWO GROUND PLANES

[75] Inventors: Morgan Paul Smith, San Francisco; Paul Raj Findley, Cupertino, both of Calif.

[73] Assignee: VLSI Technology, Inc., San Jose, Calif.

[21] Appl. No.: 08/778,300

[22] Filed: Jan. 2, 1997

[51] Int. Cl.$^6$ ................................................. G06F 17/50
[52] U.S. Cl. ........................ 364/489; 364/488; 364/578
[58] Field of Search .................................... 364/488, 489, 364/490, 491, 578

[56] References Cited

U.S. PATENT DOCUMENTS

| Re. 35,671 | 11/1997 | Hartoog | 364/491 |
|---|---|---|---|
| 5,295,088 | 3/1994 | Hartoog et al. | 364/578 |
| 5,359,534 | 10/1994 | Fujiki et al. | 364/489 |
| 5,452,224 | 9/1995 | Smith, Jr. et al. | 364/488 |
| 5,610,833 | 3/1997 | Chang et al. | 364/491 |
| 5,638,294 | 6/1997 | Sasada | 364/491 |
| 5,694,344 | 12/1997 | Yip et al. | 364/578 |
| 5,706,206 | 1/1998 | Hammer et al. | 364/489 |
| 5,737,580 | 4/1998 | Hathaway et al. | 364/490 |
| 5,761,076 | 6/1998 | Miki | 364/488 |
| 5,761,080 | 6/1998 | DeCamp et al. | 364/490 |

Primary Examiner—Vincent N. Trans
Attorney, Agent, or Firm—Wagner,Murabito&Hao

[57] ABSTRACT

The present invention provides a computer implemented method and apparatus for determining the total capacitance of a primary interconnect line positioned between top and bottom ground planes. The primary interconnect line is positioned at a distance, H1, from the bottom ground plane and at a distance, H2, from the top ground plane. Preferred embodiments of the present invention include computer implemented processes for empirically determining the total capacitance of the primary interconnect line both with and without neighboring interconnect lines present. Core steps of the present invention include partitioning of a parameter representing fringe capacitance which is due to fringe electric fields induced between sidewalls of the primary interconnect line and the top and bottom ground planes. In the present invention, the fringing capacitance is partitioned into a top fringe capacitance, $C_f(H2)$, which is due to electric fields induced between the sidewalls of the interconnect line and the top ground plane, and a bottom fringe capacitance, $C_f(H1)$, which due to electric fields induced between the sidewalls of the interconnect line and the bottom ground plane. The total fringing capacitance is modeled according to:

$Cf=f(x)*Cf(H1)+g(x)*Cf(H2)$; where $x=H2/H1$. Partitioning functions, $f(x)$ and $g(x)$, are generated according to the following constraints: $g(x)=f(1/x)$; $f(0)=0$; $g(0)=1$; Limit $(x\to\text{infinity})$ $f(x)\to1$; Limit $(x\to\text{infinity})$ $g(x)\to0$; and $1<f(1)+g(1)<2$.

14 Claims, 4 Drawing Sheets

APPARATUS AND METHOD FOR EXTRACTING CAPACITANCE IN THE PRESENCE OF TWO GROUND PLANES

FIELD OF THE INVENTION

The present invention pertains to a method for determining the capacitance of an interconnect line within an integrated circuit (IC). More particularly, the present invention relates to an empirical method for determining the capacitance of an interconnect line in the presence of two ground planes.

BACKGROUND OF THE INVENTION

Interconnect lines in IC's are typically composed of metal segments. In most IC's, interconnect lines are disposed in vertical layers wherein the interconnect lines in adjacent layers are orthogonal to each other. A metallization line formed on one layer can be connected to a metallization line formed on another layer by a via. During operation of IC's, electric fields are induced between metallization lines positioned horizontally adjacent to each other in the same layer and between metallization lines positioned vertically overlapping to each other in overlapping layers.

Capacitance of an interconnect line in an IC can cause propagation delays for signals propagating through the interconnect line. Signal propagation delays slow down the speed of an IC. Therefore, it is important for IC designers to determine the capacitance associated with interconnect lines in IC's in order to assess the speed at which a new design or layout might run. Propagation delays through interconnect lines may increase as interconnect line lengths increase or interconnect line packing density increases. In very large scale integration (VLSI) IC's, which include interconnect lines with very small spacings and very large heighth-to-width ratios, the capacitance of the interconnect lines is a limiting factor in the functioning speed of the IC. Without a reliable method for determining the capacitance of interconnect lines in an IC, an IC designer cannot predict how the interconnect line will function prior to design, fabrication, and test.

Various prior art numerical analysis methods for estimating capacitances of interconnect lines in IC's are well known. However, these numerical analysis methods are very rigorous and time consuming and therefore not amenable to use in computer aided design systems (CAD systems). CAD systems utilize various empirical methods for estimating capacitance of interconnect lines. Prior art empirical methods are less rigorous and less time consuming, but also less accurate than the numerical analysis methods. In typical prior art empirical methods, metallization lines, disposed in layers adjacent to an interconnect line under test, are modeled as ground planes. Sakurai provides one example of an empirical method for estimating capacitance per unit length of an interconnect line in the presence of a single ground plane. "Simple Formula for Two- and Three-Dimensional Capacitances", by T. Sakurai and K. Tamaru, Transactions on Electron devices, Vol. ED-30, No. 2, February 1983, pages 183–185. However, in order to determine the capacitance of an interconnect line in an integrated circuit, it is necessary to consider capacitive coupling of the interconnect line with two ground planes present. This is due to the fact that metallization lines, approximated as ground planes, are often positioned in adjacent vertical layers above and below the interconnect line under test in an integrated circuit.

One prior art CAD system, the "Compass Interconnect Extract Tool", employs an empirical method for estimating the capacitance of a single interconnect line positioned between two ground planes. However, the prior art Compass method and apparatus yields inaccurate estimates of the capacitance of an interconnect line in the presence of two ground planes. One problem contributing to a lack of accuracy of the prior art method is an over counting of fringing capacitance due to fringe electric fields induced between sidewalls of the interconnect line under test and ground planes. In the case of an interconnect line positioned between a top ground plane and a bottom ground plane, fringe electric fields are induced between the interconnect line and the top and bottom ground planes. A top fringe electric field is induced between the interconnect line and the top ground plane. A bottom fringe electric field is induced between the interconnect line and the bottom ground plane. The Compass method and other prior art methods do not take into account perturbative effects caused by the simultaneous presence of the two ground planes on the respective fringe electric fields and thus their effects on the capacitance.

Thus, a need exists for a fast and accurate empirical method for estimating the capacitance of an interconnect line in the presence of two ground planes. More specifically, a need exists for such an empirical method in which perturbative effects, of the top and bottom ground planes on the fringe electric fields and capacitance, are taken into account. A further need exists for such an empirical method which is fast, does not require excessive processing time, and also produces extremely accurate results.

SUMMARY OF THE INVENTION

The present invention provides a computer implemented method and apparatus for determining the total capacitance of a primary interconnect line positioned between a top ground plane and a bottom ground plane. Preferred embodiments of the present invention include computer implemented processes for empirically determining the total capacitance of the primary interconnect line both with and without horizontally neighboring interconnect lines positioned in close proximity to the primary interconnect line.

Core steps of the present invention include partitioning of a parameter representing fringe capacitance. The fringe capacitance is due to fringe electric fields induced between sidewalls of the primary interconnect line and the top and bottom ground planes. With two ground planes present, the total fringe capacitance of an interconnect line consists of (1) a top fringe capacitance contribution due to top fringe electric fields induced between sidewalls of the primary interconnect line and the top ground plane, and (2) a bottom fringe capacitance contribution, due to bottom fringe electric fields induced between sidewalls of the primary interconnect line and the bottom ground plane. Partitioning of the fringe capacitance parameter into parameters representing the top and bottom fringe capacitance contributions is necessary because in the actual physical case, the total fringe capacitance is not simply the sum of the top and bottom fringe capacitances considered in respective isolation (i.e. top only and then bottom only). Perturbative effects due to the simltaneous presence of the top and bottom ground planes are taken into account in the computer implemented method of the present invention for determining the total capacitance of the primary interconnect line.

The present invention provides a set of constraints defining a pair partitioning functions for modeling the total fringe capacitance of the primary interconnect line in the presence of a top and a bottom ground plane. These constraints are based upon the physical geometry of the primary interconnect line, the top and bottom ground plane, and the neighboring interconnect lines (if present). Partitioning functions satisfying the constraints of the present invention yield accurate empirical determinations of the total capacitance of the primary interconnect line.

A first embodiment of the present invention pertains to a computer implemented method for determining a total capacitance value of an interconnect line positioned between a top ground plane and a bottom ground plane without any neighboring interconnect lines positioned in close proximity to the interconnect line. The interconnect line is positioned at a distance H1 from the bottom ground plane and at a distance H2 from the top ground plane. The interconnect line has a width, W, and a thickness, T. The total capacitance, $C_{sole}$, of the interconnect line is determined according to the below relationship.

$$C_{sole}=Ca(H1)+Ca(H2)+f(x)*Cf(H1)+g(x)*Cf(H2)$$

A plurality of computer implemented steps are provided for determining the total capacitance of the interconnect line according to the above relationship. A bottom single ground plane capacitance value, $C_{single}(H1)$, is determined. $C_{single}(H1)$ represents the capacitance of the interconnect line without the top ground plane present. A top single ground plane capacitance value, $C_{single}(H2)$, is also determined. $C_{single}(H2)$ represents the capacitance of the interconnect line without the bottom ground plane present. A bottom surface area capacitance value, $C_a(H1)$, due to electric fields induced between a bottom surface of the interconnect line and the bottom ground plane, is determined. A top surface capacitance value, $C_a(H2)$, due to electric fields induced between a top surface of the interconnect line and the top ground plane, is determined. $C_a(H1)$ is subtracted from $C_{single}(H1)$ to determine a bottom fringe capacitance value, $C_f(H1)$ due to electric fields induced between sidewalls of the interconnect line and the bottom ground plane in the absense of a top ground plane. $C_a(H2)$ is subtracted from $C_{single}(H2)$ to determine a top fringe capacitance value, $C_f(H2)$, due to electric fields induced between the sidewalls of the interconnect line and the top ground plane in the absence of a bottom ground plane. $C_f(H1)$ is multiplied by a first partitioning functions, f(x), to determine a first product, $f(x)*Cf(H1)$, wherein x=H2/H1. $C_f(H2)$ is multiplied by a second partitioning function, g(x), to determine a second product, $g(x)*C_f(H2)$. The first product, $f(x)*C_f(H1)$, is added to the second product, $g(x)*C_f(H2)$, to determine a total fringe capacitance value. Finally, the values, $C_a(H1)$, $C_a(H2)$, and $C_f$ are summed to determine a total capacitance value of the interconnect line.

In the method of the present invention, partitioning functions, f(x) and g(x), are constrained according to the following relations:

$$g(x)=f(1/x);$$

f(0)=0;

g(0)=1;

Limit (x→infinity) f(x)→1;

Limit (x→infinity) g(x)→0; and

1<f(1)+g(1)<2.

The constraint, g(x)=f(1/x), reflects the symmetry expected from considerations of the physical characteristics of the interconnect line positioned between the top and bottom ground plane. The constraints, f (0)=0, g(0)=1, limit (x→infinity) f(x)→1, and limit (x→infinity) g(x)→0 reflect the limiting behavior of the fringing capacitance expected from considerations of the physical geometry of the interconnect line positioned between the top and bottom ground plane. The constraint 1<f(1)+g(1)<2 represents the boundedness expected in the total fringing capacitance when two ground planes are present (i.e., that it must be less than the sum of considering the two ground planes separately).

A second embodiment of the present invention is a computer implemented method for determining a total capacitance value of a primary interconnect line positioned between a first neighboring interconnect line and a second neighboring interconnect line wherein each of the interconnect lines is positioned between a pair of ground planes.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
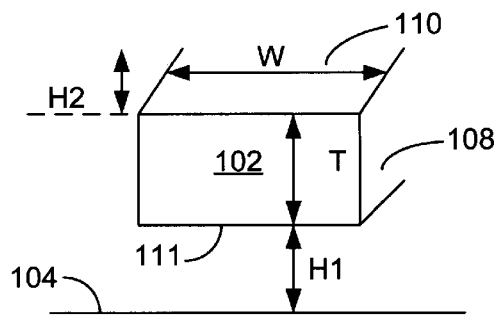
FIG. 1 is a perspective view of a single interconnect line positioned between two ground planes.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed description which follow are presented in terms of procedures, logic blocks, processing, and other symbolic representations of operations on data bits within a computer memory. These descriptions and representations are the means used by those skilled in the computer implemented electrical circuit simulation arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "partitioning", "simulating", "determining", "providing", "receiving", or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices.

The present invention provides computer implemented processes for determining the capacitance of an interconnect line positioned between a top ground plane and a bottom ground plane. With reference to FIG. 1, a perspective view is shown of a primary interconnect line 102 positioned between a bottom ground plane 104 and a top ground plane 106. The primary interconnect line 102 has a width, W, and a thickness, T. The primary interconnect line 102 is positioned at a distance, H1, from the bottom ground plane 104 and at a distance, H2, from the top ground plane 106. Surface area electric field lines (not shown) are induced between top and bottom surfaces 110 of the primary interconnect line 102 and the top and bottom ground planes 106, 104. Fringe electric fields (not shown) are induced between sidewalls 108 of the primary interconnect line 102 and the top and bottom ground planes 106, 104. A fringe capacitance, $C_f$, is the total contribution to the capacitance of the primary interconnect line 102 due to the fringe electric fields. In the method of the present invention, a parameter, $C_f$, representing the fringe capacitance is partitioned. A bottom fringe capacitance, $C_f(H1)$, is due to electric fields induced between the sidewalls 108 of the primary interconnect line 102 and the bottom ground plane 104. A top fringe capacitance, $C_f(H2)$, is due to electric fields induced between the sidewalls 108 of the primary interconnect line 102 and the top ground plane 106.

Figure 2:
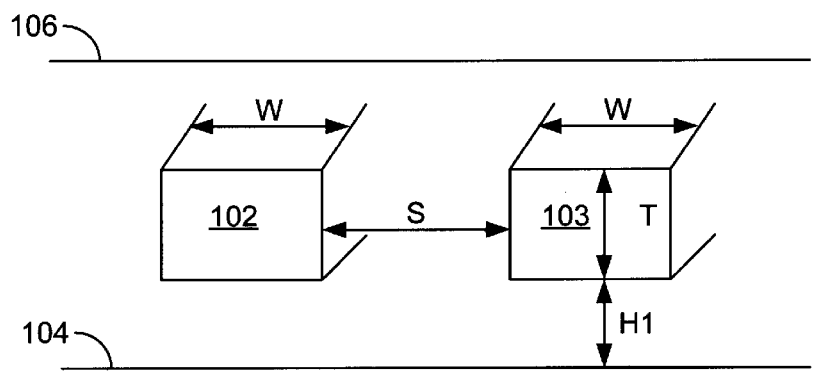
FIG. 2 is a perspective view of two interconnect lines positioned between two ground planes.

With reference to FIG. 2, a perspective view is shown of the primary interconnect line 102 positioned between the bottom ground plane 104 and the top ground plane 106 with a first neighboring interconnect line 103 positioned parallel to the primary interconnect line 102 at a distance S away. The primary interconnect line 102 and first neighboring interconnect line 103 each have a width, W, and a thickness, T. The primary interconnect line 102 and first neighboring interconnect line 103 are positioned at a distance, H1, from the bottom ground plane 104 and at a distance, H2, from the top ground plane 106. Fringe electric fields (not shown) extend from sidewalls 108 of the primary interconnect line 102 to the ground planes 104, 106. Surface area electric fields (not shown) extend from top and bottom surfaces 110 of the primary interconnect line 102 to the ground planes 104, 106.

Figure 3:
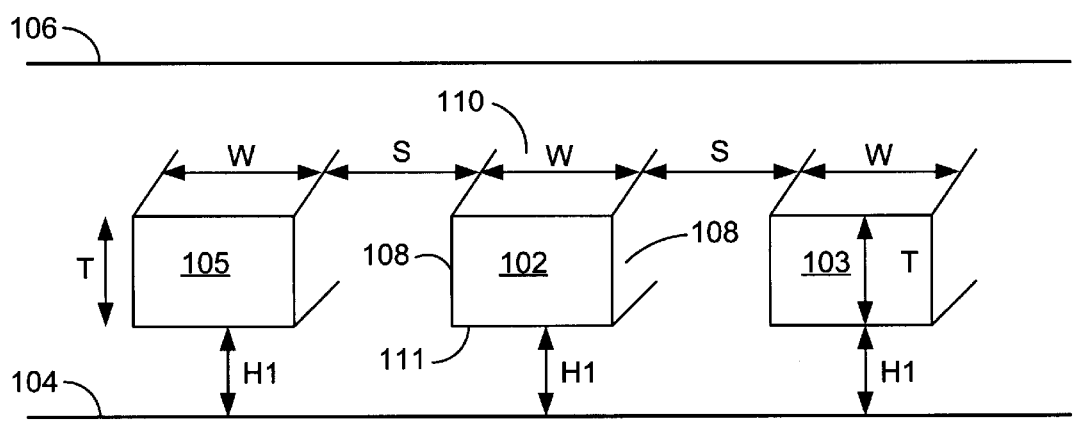
FIG. 3 is a perspective view of three interconnect lines positioned between two ground planes.

With reference to FIG. 3, a perspective view is shown of the primary interconnect line 102 positioned between the bottom ground plane 104 and the top ground plane 106. A first neighboring interconnect line 103 is positioned parallel to the primary interconnect line 102 at a distance S away. A second neighboring interconnect line 105 is positioned parallel to the primary interconnect line 102 also at a distance S away. Each of the neighboring interconnect lines 103, 105 and the primary interconnect line 102 has a width, W, and a thickness, T. Each of the interconnect lines 102, 103, 105 is positioned at a distance, H1, from the bottom ground plane 104 and at a distance, H2, from the top ground plane 106. Fringe electric field lines (not shown) are induced between sidewalls 108 of the primary interconnect line 102 and the ground planes 104, 106. Surface area electric field lines (not shown) are induced between the top and bottom surfaces 110 of the primary interconnect line 102 and the ground planes 104, 106.

Figure 4:
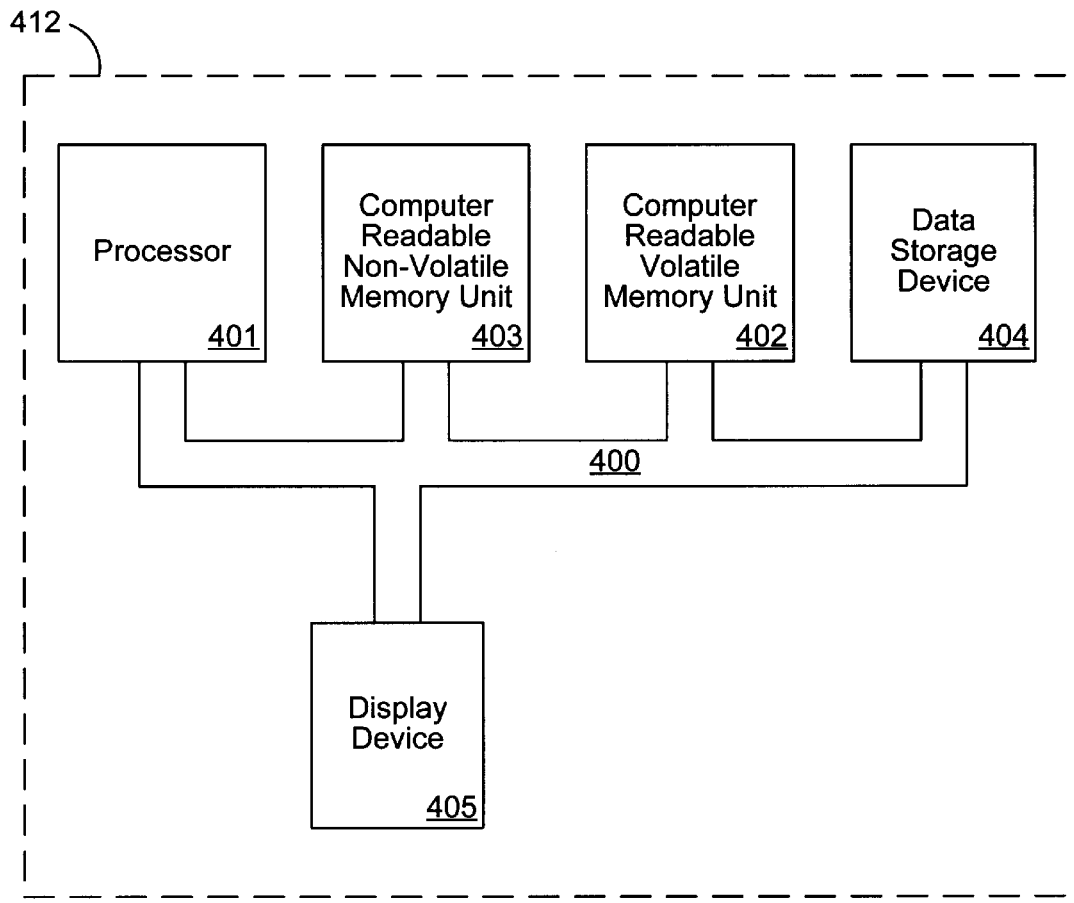
FIG. 4 is a block diagram of an exemplary host computer system for employing processes of the present invention.

Refer to FIG. 4 which illustrates a host computer system 412. In general, host computer systems 412 used by the present invention comprise a bus 400 for communicating information, a host processor 401 coupled with the bus for processing information and instructions, a computer readable volatile memory unit 402 (e.g., random access memory unit) coupled with the bus 400 for storing information and instructions for the host processor 401, a computer readable non-volatile memory unit 403 (e.g., read only memory unit) coupled with the bus 400 for storing static information and instructions for the host processor 401, a data storage device 404 such as a magnetic or optical disk and disk drive coupled with the bus 400 for storing information and instructions, and a display device 405 coupled to the bus 400 for displaying information to the computer user.

Figure 5:
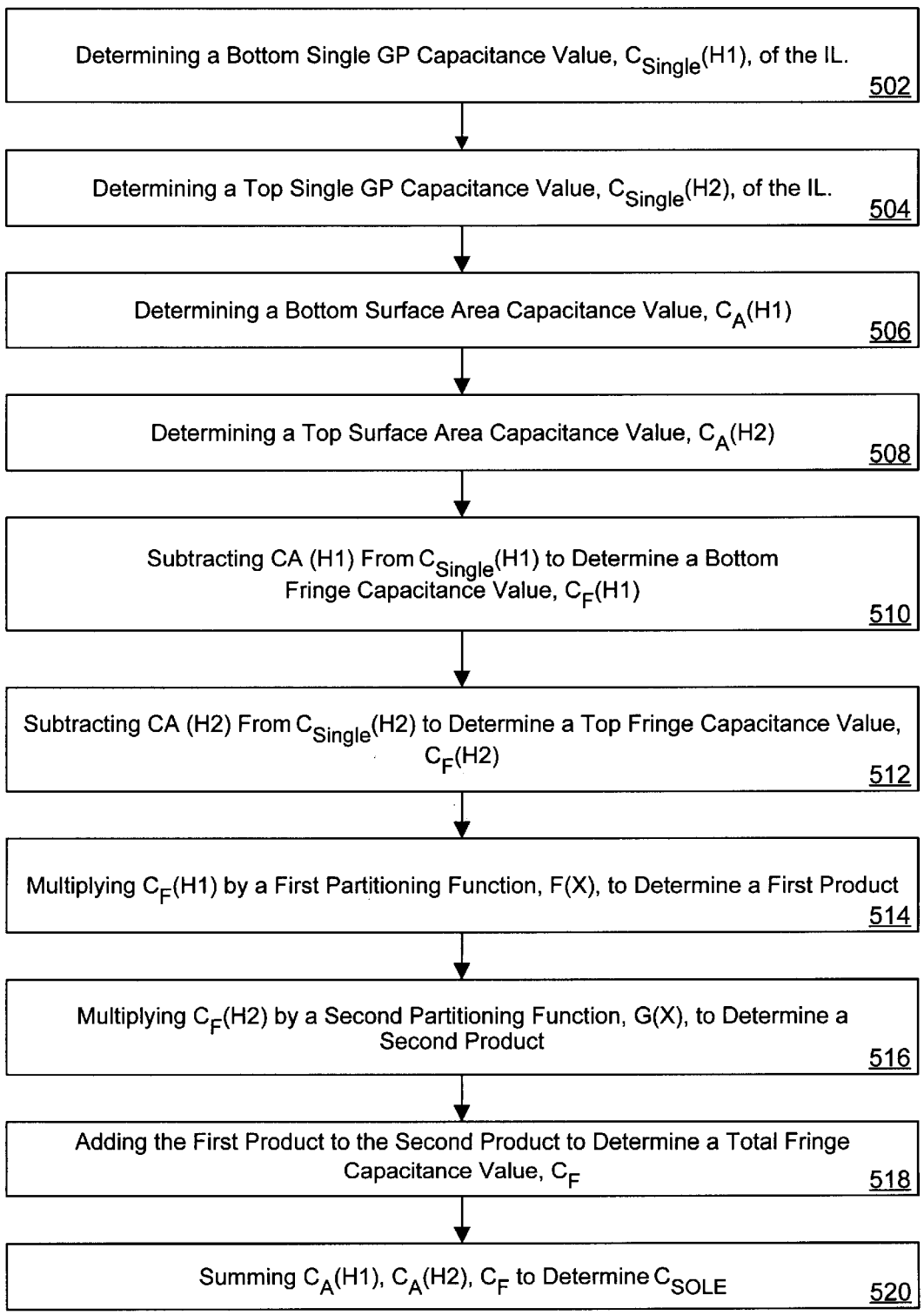
FIG. 5 is a flow diagram of steps of a first computer implemented process of the present invention for determining the capacitance of a single interconnect line positioned between top and bottom ground planes.

With reference to FIG. 5, a flow diagram is shown of steps of a first computer implemented process 500 of the present invention for determining the capacitance of the single primary interconnect line 102 positioned between the top and bottom ground planes 104, 106 without any neighboring interconnect lines present (FIG. 1). Process 500 is implemented as program code stored in computer readable memory units of computer system 412 (FIG. 4). The program code is executed over host processor 401 to perform the below described steps (FIG. 4).

Step 502 of FIG. 5 determines a bottom single ground plane capacitance value, $C_{single}(H1)$. $C_{single}(H1)$ represents the capacitance per unit length of the primary interconnect line 102 positioned at a distance, H1, from the bottom ground plane 104 without the top ground plane 106 present (FIG. 1). One equation for determining $C_{single}(H1)$ is given by:

$$C_{single}(H1) = E_d * [1.15 \ (W/H1) + 2.80 \ (T/H1)^{0.222}] \quad (1A)$$

Whereby $E_d$ is the dielectric permitivity of the material in which the interconnect lines are embedded (e.g., for silicon dioxide, Ed is approximately $3.45 \times 10^{-13}$ Farads per cm.)

Step 504 of FIG. 5 determines a top single ground plane capacitance value, $C_{single}(H2)$. $C_{single}(H2)$ is the capacitance per unit length of the primary interconnect line 102 positioned at a distance, H2, from the top ground plane 106 without the bottom ground plane 104 present (FIG. 1). In a preferred embodiment of the present invention, $C_{single}(H2)$ is determined according to Relationship (1B), below.

$$C_{single}(H2)=E_d*[1.15\ (W/H2)+2.80\ (T/H2)^{0.222}] \quad (1B)$$

Step 506 of FIG. 5 determines a bottom surface area capacitance value, $C_a(H1)$. $C_a(H1)$ is defined as the bottom surface area capacitance due to electric fields induced between the bottom surface 111 of the primary interconnect line 102 and the bottom ground plane 104 (FIG. 1). In a preferred embodiment of the present invention, $C_a(H1)$ is determined according to Relationship (2A) below.

$$Ca(H1)=E_d/H1 \quad (2A)$$

Step 508 of FIG. 5 determines a top surface area capacitance value, $C_a(H2)$. $C_a(H2)$ is defined as the top surface area capacitance due to electric fields induced between the top surface 110 of the primary interconnect line 102 and the top ground plane 106 (FIG. 1). In a preferred embodiment of the present invention, $C_a(H2)$ is determined according to Relationship (2B) below.

$$Ca(H2)=E_d/H2 \quad (2B)$$

Relationships (2A) and (2B) define values of capacitance per unit area. Relationships (2A) and (2B) are multiplied by the width, W, of the primary interconnect line 102 to convert to capacitance per unit length (FIG. 1). It is understood that in the present invention, other relationships can be used to estimate the capacitance value of the pure surface area capacitance components, Ca(H1) and Ca(H2).

Step 510 of FIG. 5 subtracts the bottom surface area capacitance value, $C_a(H1) \times W$, from the bottom single ground plane capacitance value, $C_{single}(H1)$, to determine a bottom fringe capacitance value, $C_f(H1)$. Step 510 is performed in accordance with Relationship (3A), below.

$$Cf(H1)=C_{single}(H1)-Ca(H1)*W \quad (3A)$$

Step 512 of FIG. 5 calls for subtracting the top surface area capacitance value, $C_a(H2)*W$, from the top single ground plane capacitance value, $C_{single}(H2)$, to determine a top fringe capacitance value, $C_f(H2)$. Step 510 is performed in accordance with Relationship (3B), below.

$$Cf(H2)=C_{single}(H2)-Ca(H2)*W \quad (3B)$$

The terms in eq 3A & 3B represent quantities of capacitance per unit length. Relationship (4), below, defines a parameter, x, used in each of the methods of the present invention;

$$x=H2/H1 \quad (4)$$

where H1 is the distance from the primary interconnect line 102 to the bottom ground plane 104 and H2 is the distance from the primary interconnect line 102 to the top ground plane 106 as shown in FIG. 1.

In the present invention, a pair of partitioning functions, f(x) and g(x), are provided for defining the value of the contribution of the fringing capacitance, $C_{fringe}$, when two ground planes are present. In the present invention, the total capacitance, $C_{sole}$, per unit length of the primary interconnect line 102 is determined according to Relationship (5A), below.

$$Csole=Carea+Cfringe=Ca(H1)*W+Ca(H2)*W+f(x)*Cf(H1)+g(x)*CF(H2) \quad (5A)$$

Carea=Ca(H1)+Ca(H2) & $C_{fringe}$=f(x)Cf(H1)+g(x)Cf(H2).

Substituting Relationships (3A) and (3B) into Relationship (5A) results in Relationship (5B), below.

$$C_{sole}=Ca(H1)*W+Ca(H2)*W+f(x)*[C_{single}(H1)-Ca(H1)*W]+g(x)*[C_{single}(H2)-Ca(H2)*W] \quad (5B)$$

In the method of the present invention, appropriate partitioning functions, f(x) and g(x), have the properties described in constraints (6) through (11), below;

$$g(x)=f(1/x) \quad (6)$$

$$f(0)=0 \quad (7)$$

$$g(0)=1 \quad (8)$$

$$\text{Limit}(x \to \text{infinity})f(x) \to 1 \quad (9)$$

$$\text{Limit}(x \to \text{infinity})g(x) \to \quad (10)$$

$$1 < f(1)+g(1) < 2 \quad (11)$$

Constraint (6) reflects the symmetry expected from considerations of the physical characteristics of the primary interconnect line 102 in the presence of the top and bottom ground planes 106, 104 (FIG. 1). Constraints (7) through (10) reflect the correct limiting behavior of the fringing capacitance, $C_f$, expected from considerations of the physics. Constraint (11) represents the boundedness expected in the total fringing capacitance when two ground planes are present (FIG. 1).

An example of a pair of partitioning functions that possess the desired properties is stated below in Relationships (12) and (13).

$$f(x)=x/(x+b) \quad (12)$$

$$g(x)=f(1/x)=1/(1+bx) \quad (13)$$

b is an empirical fitting parameter whose value is between 0 and 1, exclusive. The empirical fitting parameter, b, sets the "gain" of the combination. When x=1, the ground planes 106, 104 are equidistant from the primary interconnect line 102 and f(1) and g(1) are equal, as expressed in Relationship (14), below.

$$F(1)=G(1)=1/(1+b) \quad (14)$$

Substituting x=1 (or H1=H2) into Relationship (5A), above, results in Relationships (15A) and (15B), below.

$$C_{sole}=Ca(H1)*W+Ca(H1)*W+f(1)*Cf(H1)+g(1)*Cf(H1) \quad (15A)$$

$$C_{sole}=2*Ca(H1)*W+(2/(1+b))*[C_{single}(H1)-Ca(H1)] \quad (15B)$$

If b=0, then the total fringe capacitance Cfringe is equal to ($2*C_f$) which is an overestimate of the total fringe capacitance which is less than ($2*C_f$) due to perturbative effects of having two ground planes present. If b is between 0 and 1, we get an intermediate result. In the present invention, b is determined by fitting to actual data or simulation data. In a preferred embodiment of the present invention, b=0.75.

In Process 500 of FIG. 5, Relationship (5A), reprinted below, is implemented according to steps 514 though 520.

$$C_{sole}=Ca(H1)*W+Ca(H2)*W+f(x)*Cf(H1)+g(x)*Cf(H2) \quad (5A)$$

Step 514 of FIG. 5 multiplies $C_f(H1)$ by the first partitioning function, f(x), to determine a first product, $f(x)*C_f(H1)$. Step 516 of FIG. 5 multiplies $C_f(H2)$ by the second partitioning function, g(x), to determine a second product, $g(x)*C_f(H2)$. Step 518 of FIG. 5 combines the first product, $(f(x)*C_f(H1))$, with the second product, $(g(x)*C_f(H2))$, to determine a total fringe capacitance value, Cfringe, for the interconnect line 102 (FIG. 1). Step 520 of FIG. 5 combines $C_a(H1)$, $C_a(H2)$, and Cfringe to determine the capacitance value, $C_{sole}$, of the primary interconnect line 102 in the presence of top and bottom ground planes 104, 106 without any neighboring interconnect lines present (FIG. 1).

Figure 6:
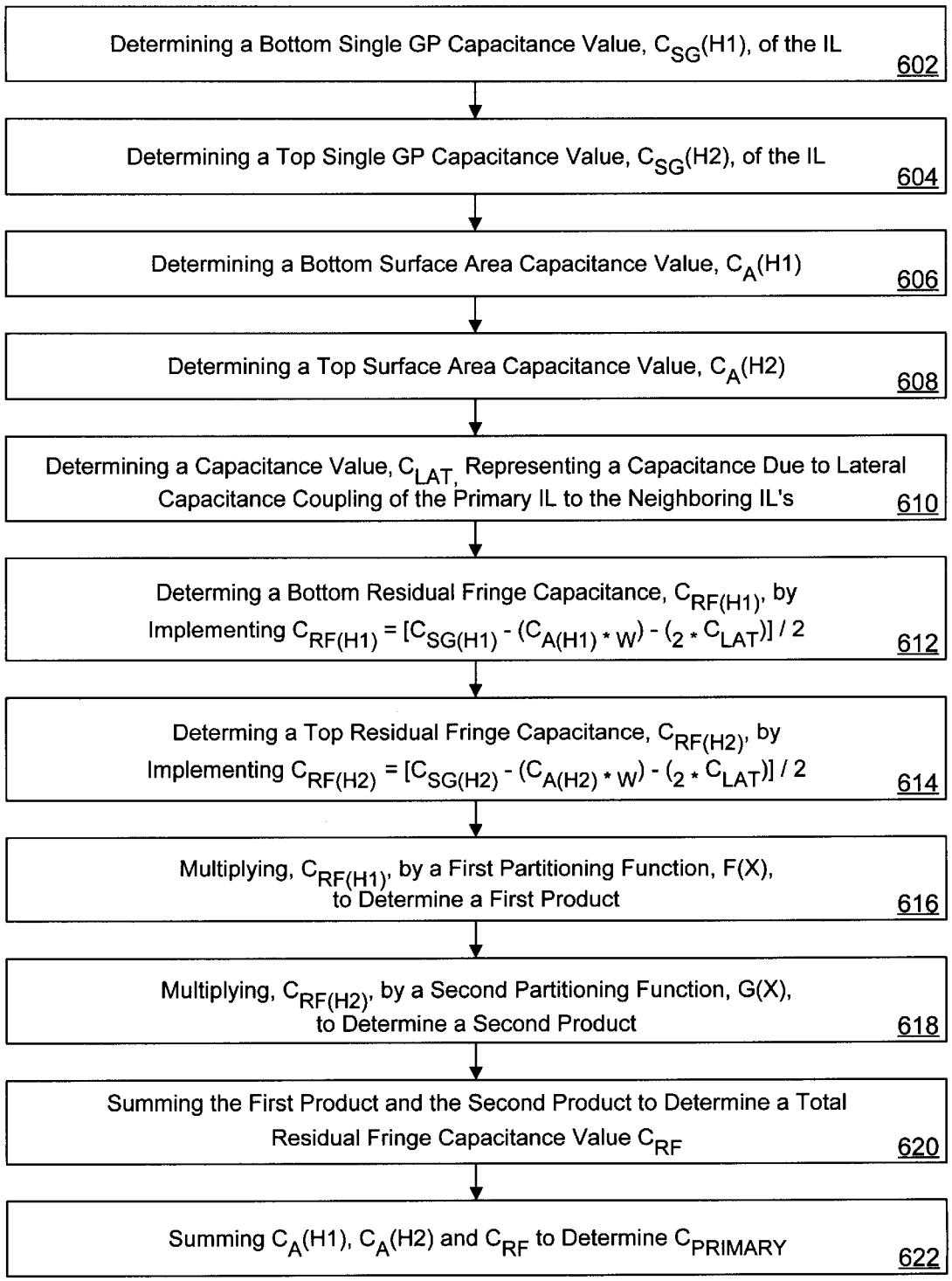
FIG. 6 is a flow diagram of steps of a second computer implemented process of the present invention for determining a capacitance value for a primary interconnect line positioned between first and second neighboring interconnect lines in the presence of top and bottom ground planes.

With respect to FIG. 6, a flow diagram is shown of steps of a second computer implemented process 600 of the present invention. Process 600 determines a total capacitance value for the primary interconnect line 102 positioned between the top and bottom ground plane 106, 104 in the presence of the first and second neighboring interconnect lines 103, 105 and (FIG. 3). Process 600 is implemented as program code stored in the computer readable memory units of computer system 412 (FIG. 4). The program code is executed over host processor 401 to perform the below described steps (FIG. 4).

The case for treating neighboring lines is now described. Step 602 of FIG. 6 determines a bottom single ground plane capacitance value, $C_{sg}(H1)$, of the primary interconnect line 102 positioned between the first and second neighboring interconnect lines 103, 105 with the bottom ground plane 104 present but without the top ground plane 106 present (FIG. 3). In a preferred embodiment of the present invention, Relationship (16A), below, can be used to estimate $C_{sg}(H1)$.

$$C_{sg}(H1)=E_d*[(C_{single(H1)}/E_d)+2*[0.03(W/H1)+0.83(T/H1)-0.07(T/H1)^{0.222}]*(S/H1)^{-1.34}] \quad (16A)$$

Step 604 of FIG. 6 determines a top single ground plane capacitance value, $C_{sg}(H2)$, of the primary interconnect line 102 positioned between the first and second neighboring interconnect lines 103, 105 with the top v 106 present but without the bottom ground plane 104 present (FIG. 3). In a preferred embodiment of the present invention, Relationship (16B), below, can be used to estimate $C_{sg}(H2)$.

$$C_{sg}(H2)=E_d*[(C_{single(H2)}/E_d)+2*[0.03(W/H2)+0.83(T/H2)-0.07(T/H2)^{0.222}]*(S/H2)^{-1.34}] \quad (16B)$$

Step 606 of FIG. 6 determines the bottom surface area capacitance value, $C_a(H1)$ of the primary interconnect line 102 positioned between the first and second neighboring interconnect lines 103, 105 in the presence of the top and bottom ground planes 104, 106 (FIG. 3). As previously mentioned, Ca(H1) is defined as the capacitance due to electric fields induced between the bottom surface 111 of the primary interconnect line 102 and the bottom ground plane 104. In a preferred embodiment of the present invention, $C_a(H1)$ is determined according to Relationship (2A), reprinted below.

$$Ca(H1)=E_d/H1 \quad (2A)$$

where $E_d$ is the dielectric constant of the medium in which the primary interconnect line 102 is embedded. As previously mentioned, Relationship (2A) defines a value of capacitance per unit area. Relationship (2A) can be multiplied by the width, W, of the primary interconnect line 102 to convert to capacitance per unit length.

Step 608 of FIG. 6 determines the top surface area capacitance value, $C_a(H2)$ of the primary interconnect line 102 positioned between the first and second neighboring interconnect lines 103, 105 in the presence of the top and bottom ground planes 104, 106 (FIG. 3). As previously mentioned, Ca(H2) is defined as the capacitance due to electric fields induced between the top surface 110 of the primary interconnect line 102 and the top ground plane 106. In a preferred embodiment of the present invention, $C_a(H2)$ is determined according to Relationship (2B), reprinted below.

$$Ca(H2)=E_d/H2 \quad (2B)$$

Relationship (2B) defines a value of capacitance per unit area. Relationship (2B) can be multiplied by the width, W, of the primary interconnect line 102 to convert to capacitance per unit length.

Step 610 of the process 600 of FIG. 6 of the present invention determines a capacitance value, $C_{lat}$, representing the total lateral capacitive coupling between the primary interconnect line 102 and the first and second neighboring interconnect lines 103, 105 in the presence of the top and bottom ground planes 104, 106 (FIG. 3). With reference to FIG. 3, $C_{lat}$ represents a capacitance due to the total lateral capacitive coupling between the primary interconnect line 102 and the neighboring interconnect lines 103, 105. $C_{fringe}$ represents a capacitance due to electric fields induced between the sidewalls 108 of the primary interconnect line 102 and the top and bottom ground planes 104, 106.

In a preferred method of the present invention, $C_{lat}$ is determined according to Relationship (18), below;

$$Clat=a*T/s \quad (18)$$

where a is an empirical constant and s is the separation distance between the primary interconnect line 102 and the neighboring interconnect lines 103, 105 (FIG. 3). It is understood that, in the present invention, various other relationships can be used to estimate the total lateral capacitive coupling, Clat, between the primary interconnect line 102 and the neighboring interconnect lines 103, 105 (FIG. 3).

Step 612 of FIG. 6 determines a bottom residual fringe capacitance, $C_{rf}(H1)$. $C_{rf}(H1)$ is defined as the residual fringe capacitance after $C_{lat}$ has been removed. In the method of the present invention, $C_{rf}(H1)$ is determined according to Relationship (19), below.

$$Crf(H1)=Csg(H1)-Ca(H1)*W-2*Clat \quad (19)$$

where $C_{rf}$ is defined as the bottom residual fringe capacitance after $C_{lat}$ has been removed.

Step 614 of FIG. 6 determines a top residual fringe capacitance, $C_{rf}(H2)$. $C_{rf}(H2)$ is defined as the residual fringe capacitance after $C_{lat}$ has been removed. In the method of the present invention, $C_{rf}(H2)$ is determined according to Relationship (20), below $$Crf(H2)=Csg(H2)-Ca(H2)\times W-Z*Clat \quad (20)$$

With reference to FIG. 3, the total capacitance, $C_{primary}$, of the primary interconnect line 102 positioned between the first and second neighboring interconnect lines 103, 105 in the presence of the top and bottom ground planes 104, 106 (FIG. 3) is defined according to Relationship (21), below.

$$C_{primary}=C_a(H1)*W+C_a(H2)*W+f(x)*C_{rf}(H1)+g(x)*C_{rf}(H2)+2*C_{lat} \quad (21)$$

Steps 616 through 622 implement Relationship (21), above. Step 616 of FIG. 6 multiplies $C_{rf}(H1)$ by a first partitioning function, f(x), to determine a first partitioned product, $f(x)*C_{rf}(H1)$. Step 618 of FIG. 6 multiplies $C_{rf}(H2)$ by a second partitioning function, g(x), to determine a second partitioned product, $g(x)*C_{rf}(H1)$. Step 620 of FIG. 6 combines the first product, $(f(x)*C_{rf}(H1))$ and the second product, $(g(x)*C_{rf}(H1))$ to determine a total residual fringe capacitance, $C_{rf}$. Step 622 of FIG. 6 combines $C_a(H1)$, $C_a(H2)$, and $C_{rf}$ to yield the total capacitance value, $C_{primary}$, of the primary interconnect line 102 positioned between the neighboring interconnect lines 103, 105 in the presence of the top and bottom ground planes 106, 104 (FIG. 3).

Several embodiments to the present invention may be practiced. In one such embodiment, only one neighboring line is present (see FIG. 2). For this case, one side's Cfringe value is treated as for the case of the isolated line. Meanwhile, the other side's Cfringe value is treated as for the case of the line with neighbors. In another embodiment, two neighboring lines are spaced at unequal distances (S1 and S2) apart. This situation requires that each side's Cfringe value be treated separately, according to their respective neighbor's spacing. In either of these embodiments, factors and divisions of two are utilized to account for the separate treatment of each sidewall.

The preferred embodiment of the present invention, an apparatus and method for extracting capacitance in the presence of two ground planes, is thus described. While the present invention has been described in particular embodiments, it should be appreciated that the present invention should not be construed as limited by such embodiments, but rather construed according to the below claims.

We claim:

1. In a computer aided design system, a computer implemented method for determining a capacitance value of an interconnect line positioned between a top ground plane and a bottom ground plane, said method comprising the computer implemented steps of:

determining a bottom fringe capacitance value due to electric fields induced between sidewalls of the interconnect line and the bottom ground plane and top fringe capacitance value due to electric fields induced between sidewalls of the interconnect line and the top ground plane;

generating a first partitioning function, associated with said bottom fringe capacitance value, and a second partitioning function associated with said top fringe capacitance value;

applying said first partitioning function to said bottom fringe capacitance value to determine a partitioned bottom fringe capacitance value, and applying said second partitioning function to said top fringe capacitance value to determine a partitioned top fringe capacitance value;

combining said partitioned top fringe capacitance value and said partitioned bottom fringe capacitance value to output a total fringe capacitance value; and displaying said total fringe capacitance value.

2. The computer implemented method of claim 1 wherein said first and second partitioning functions are determined according to constraints including:

(a) $g(x)=f(1/x)$;
(b) $f(0)=0$;
(c) $g(0)=1$;
(d) $\text{Limit}(x \to \infty)f(x) \to 1$;
(e) $\text{Limit}(x \to \infty)g(x) \to 0$; and
(f) $1 < f(1) + g(1) < 2$ wherein $x=(H2/H1)$ and wherein H2 is a distance between the interconnect line and the top ground plane and wherein H1 is a distance between the interconnect line and the bottom ground plane.

3. The computer implemented method of claim 1 wherein said first partitioning function is implemented according to:

$$f(x)=x/(x+b)$$

wherein b is empirical fitting parameter whose value is between 0 and 1, exclusive, and wherein $x=H2/H1$, wherein H2 is a distance between the interconnect line and the top ground plane and wherein H1 is a distance between the interconnect line and the bottom ground plane.

4. The computer implemented method of claim 1 wherein said second partitioning function is implemented according to:

$$g(x)=1/(1+bx)$$

wherein b is an empirical fitting parameter whose value is between 0 and 1, exclusive, and wherein $x=H2/H1$, wherein H2 is a distance between the interconnect line and the top ground plane, and wherein H1 is a distance between the interconnect line and the bottom ground plane.

5. The computer implemented method of claim 1 wherein said steps of determining said bottom fringe capacitance value and said top fringe capacitance value are implemented by performing the computer implemented steps of:

(a) determining a bottom single ground plane capacitance value, $C_{single}(H1)$, of said interconnect line without said top ground plane present and determining a top single ground plane capacitance value, $C_{single}(H2)$, of said interconnect line without said bottom ground plane present;

(c) determining a bottom surface area capacitance value, $C_a(H1)$, due to electric fields induced between a bottom surface of said interconnect line and said bottom ground plane;

(d) determining a top surface capacitance value, $C_a(H2)$, due to electric fields induced between a top surface of said interconnect line and said top ground plane;

(e) subtracting $C_a(H1)$ from $C_{single}(H1)$ to determine said bottom fringe capacitance value, $C_f(H1)$; and (f) subtracting $C_a(H2)$ from $C_{single}(H2)$ to determine said top fringe capacitance value, $C_f(H2)$.

6. The computer implemented method of claim 1 wherein said step of determining $C_a(H1)$ includes implementing $Ca(H1)=E_d/H1$ wherein Ed represents the dielectric constant of material interposed between and around the interconnect line and the top and bottom ground planes.

7. The computer implemented method of claim 1 wherein said step of determining $C_a(H2)$ includes implementing $Ca(H2)=E_d/H2$ wherein Ed represents the dielectric constant of material interposed between and around the interconnect line and the top and bottom ground planes.

8. A computer implemented method for determining a capacitance value, $C_{primary}$, of a primary interconnect line positioned between a top ground plane and a bottom ground plane, said primary interconnect line also positioned between a first neighboring interconnect line and a second neighboring interconnect line, wherein said primary interconnect line and said first and second neighboring interconnect lines are positioned at a distance H1 from said bottom ground plane and at a distance H2 from said top ground plane, said method comprising the computer implemented steps of:

(a) determining a bottom single ground plane capacitance value, $C_{sg}(H1)$, of said primary interconnect line without said top ground plane present;

(b) determining a top single ground plane capacitance value, $C_{sg}(H2)$, of said primary interconnect line without said bottom ground plane present;

(c) determining a bottom surface area capacitance value, $C_a(H1)$, due to electric fields induced between said primary interconnect line and said bottom ground plane;

(d) determining a top surface area capacitance value, $C_a(H2)$, due to electric fields induced between said primary interconnect line and said top ground plane;

(e) determining empirically a capacitance value, $C_{lat}$, representing a total lateral capacitive coupling of said primary interconnect line to said neighboring interconnect lines;

(f) determining a value for a bottom residual fringe capacitance, $C_{rf}(H1)$, by implementing, $$C_{rf}(H1)=[C_{sg}(H1)-(C_a(H1)*W)-(2*C_{lat})]/2;$$

(g) determining a value for a top residual fringe capacitance, $C_{rf}(H2)$, by implementing, $C_{rf}(H2)=[C_{sg}(H2)-(C_a(H2)*W)-(2*C_{lat})]/2;$ (h) multiplying $C_{rf}(H1)$ by a first partitioning function, f(x), to determine a first product and multiplying $C_{rf}(H2)$ by a second partitioning function, g(x), to determine a second product;

(j) combining said first product, said second product, and twice $C_{lat}$ to determine a total residual fringe capacitance value, $C_{rf}$; and (k) combining $C_a(H1)$, $C_a(H2)$ and $C_{rf}$ to determine $C_{primary}$.

9. The computer implemented method of claim 8 wherein said step of determining $C_{sg}(H1)$, of said primary interconnect line without said top ground plane present includes implementing;

$$C_{sg}=E_d*[(C_{single}/E_d)+2*[0.03(W/H1)+0.83(T/H1)-0.07(T/H1)^{0.222}]*(S/H1)^{-1.34}]$$

wherein, $$C_{single}=E_d*[\,1.15(W/H1)+2.80(T/H1)^{0.222}].$$

10. The computer implemented method of claim 8 wherein said step of determining $C_{sg}(H2)$, of said primary interconnect line without said bottom ground plane present includes implementing;

$$C_{sg}=E_d*[(C_{single}/E_d)+2*[0.03(W/H2)+0.83(T/H2)-0.07(T/H2)^{0.222}]*(S/H2)^{-1.34}]$$

wherein, $$C_{single}=E_d*[1.15(W/H2)+2.80(T/H2)^{0.222}].$$

11. The computer implemented method of claim 8 wherein said step of determining $C_a(H1)$ includes implementing $Ca(H1)=E_d/H1$ wherein Ed represents the dielectric constant of material interposed between and around the interconnect line and the top and bottom ground planes.

12. The computer implemented method of claim 8 wherein said step of determining $C_a(H2)$ includes implementing $Ca(H2)=E_d/H2$ wherein Ed represents the dielectric constant of material interposed between and around the interconnect line and the top and bottom ground planes.

13. The computer implemented method of claim 8 wherein said step of determining $C_{lat}$ includes implementing;

$$Clat=a*T/s$$

wherein a is an empirical constant and wherein s is the distance between said primary interconnect line and said first and second neighboring interconnect lines.

14. A computer-usable medium having computer-readable program code embodied therein for causing a computer to determine a capacitance value of an interconnect line positioned between a top ground plane and a bottom ground plane by performing the steps of:

determining a bottom fringe capacitance value due to electric fields induced between sidewalls of the interconnect line and the bottom ground plane and a top fringe capacitance value due to electric fields induced between sidewalls of the interconnect line and the top ground plane;

generating a first partitioning function, associated with said bottom fringe capacitance value, and a second partitioning function associated with said top fringe capacitance value;

applying said first partitioning function to said bottom fringe capacitance value to determine a partitioned bottom fringe capacitance value, and applying said second partitioning function to said top fringe capacitance value to determine a partitioned top fringe capacitance value;

combining said partitioned top fringe capacitance value and said partitioned bottom fringe capacitance value to output a total fringe capacitance value; and displaying said total fringe capacitance value.

* * * * *